(12) United States Patent
Sharma et al.

(10) Patent No.: US 9,848,513 B2
(45) Date of Patent: Dec. 19, 2017

(54) COOLING SYSTEMS AND METHODS

(75) Inventors: Ratnesh Kumar Sharma, Fremont, CA (US); Thomas W. Christian, Fort Collins, CO (US); Chandrakant Patel, Fremont, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 2246 days.

(21) Appl. No.: 12/833,080

(22) Filed: Jul. 9, 2010

(65) Prior Publication Data

US 2012/0006038 A1 Jan. 12, 2012

(51) Int. Cl.
| F25D 17/06 | (2006.01) |
| F25B 41/00 | (2006.01) |
| F25D 23/12 | (2006.01) |
| F25B 17/00 | (2006.01) |
| H05K 7/20 | (2006.01) |

(52) U.S. Cl.
CPC ...... *H05K 7/20745* (2013.01); *F24F 2221/40* (2013.01)

(58) Field of Classification Search
USPC .... 62/259.2, 259.4, 92, 93, 176.1, 304, 314, 62/309, 176.6, 179, 186, 180; 236/49.3, 236/44 C, 44 A, 13; 700/276, 275
See application file for complete search history.

(56) References Cited

U.S. PATENT DOCUMENTS

| 2,118,949 | A | * | 5/1938 | Scott | 62/91 |
| 7,191,607 | B2 | * | 3/2007 | Curtis | 62/186 |
| 8,036,779 | B2 | * | 10/2011 | Ito et al. | 700/277 |
| 2006/0053810 | A1 | * | 3/2006 | Cressy | 62/176.6 |
| 2006/0150644 | A1 | * | 7/2006 | Wruck | 62/126 |
| 2007/0200004 | A1 | * | 8/2007 | Kasper et al. | 236/44 C |
| 2007/0240433 | A1 | | 10/2007 | Manole | |
| 2008/0157409 | A1 | | 7/2008 | Reens | |
| 2008/0229782 | A1 | * | 9/2008 | Takegami et al. | 62/513 |
| 2009/0165484 | A1 | * | 7/2009 | Matsui | 62/271 |
| 2011/0154842 | A1 | * | 6/2011 | Heydari et al. | 62/259.2 |
| 2011/0168793 | A1 | * | 7/2011 | Kreft et al. | 236/44 C |

FOREIGN PATENT DOCUMENTS

| CN | 2226723 | 5/1996 |
| JP | 11347364 | 12/1999 |
| JP | 2009216320 | 9/2009 |

OTHER PUBLICATIONS

Evans, Tony; "Humidification Strategies for Data Centers and Network Rooms"; 2004; pp. 1-13.

* cited by examiner

*Primary Examiner* — Frantz Jules
*Assistant Examiner* — Erik Mendoza-Wilkenfel
(74) *Attorney, Agent, or Firm* — Trop, Pruner & Hu, P.C.

(57) ABSTRACT

According to one example of the present invention, a cooling system is provided. The cooling system comprises a water-cooled air conditioning module for cooling air from a chamber. The chamber is arranged for receiving air to be cooled and hot humid air. The cooling system also comprises a control system for controlling the flow of hot humid air to the chamber such that the air input to the air conditioning module has a predetermined relative humidity level within a predetermined range.

24 Claims, 7 Drawing Sheets

COOLING SYSTEMS AND METHODS

BACKGROUND

In computer data centers, and other similar facilities and structures housing heat-generating equipment, the cost of running cooling systems for cooling the equipment may constitute a large portion of the operating costs of a data center.

The majority of current data center facilities use mechanical air conditioning systems to cool air which is then used to cool equipment in the facility. The cooled air is warmed as it cools the equipment, and the warmed air is returned to the air conditioning system where it is cooled and re-circulated in the data center.

If the outside air is sufficiently cool, it may be introduced in large quantities as the principal cooling mechanism, reducing, or even eliminating in some cases, the need for mechanical cooling.

However, it is important to maintain the data center air within acceptable relative humidity levels to ensure correct operation of the data center equipment. If the outside air is dry the introduction of dry air into the data center can lead to a significant lowering of the relative humidity of the air in the data center. Excessively low relative humidity levels can lead to problems of static discharge that may damage electronic equipment in the data center. Conversely, excessively high relative humidity may lead to problems of condensation and corrosion of data center equipment and/or data center infrastructure.

Where dry outside air is introduced into a data center it is typically mixed with the warmed data center return air before being cooled and humidified to appropriate levels by the air conditioning systems.

However, the humidification of air by air conditioning systems may consume large amounts of energy, since water generally has to be heated as part of the humidification process. Furthermore, significant quantities of water may be needed to achieve required humidification levels.

BRIEF DESCRIPTION

Examples and embodiments of the invention will now be described, by way of non-limiting example only, with reference to the accompanying drawings, in which.

Figure 6:
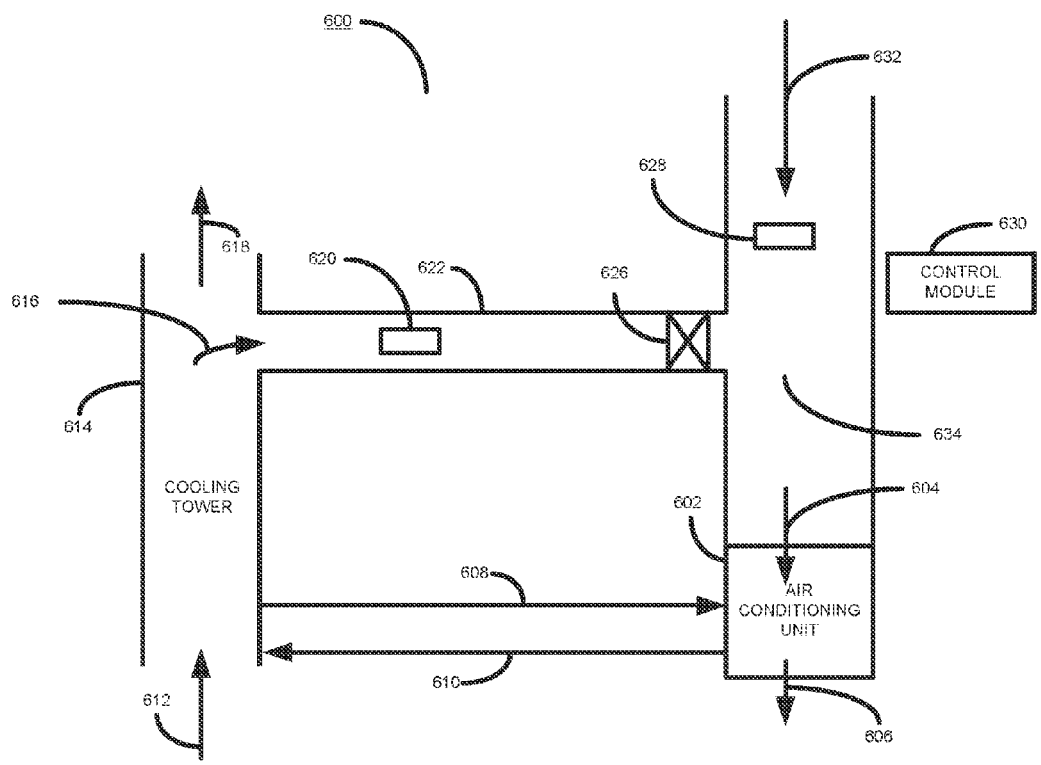
Figure 7:
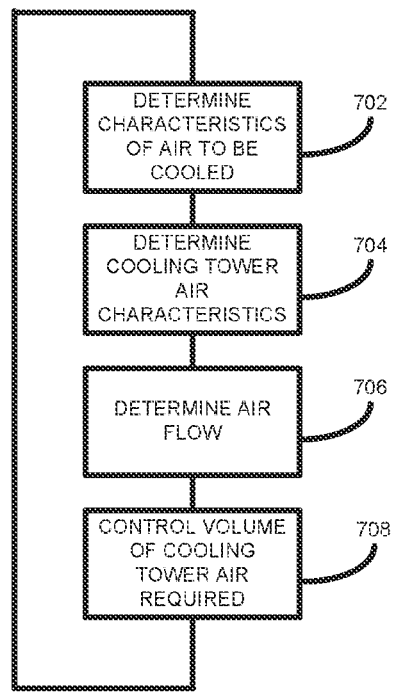
Figure 8:
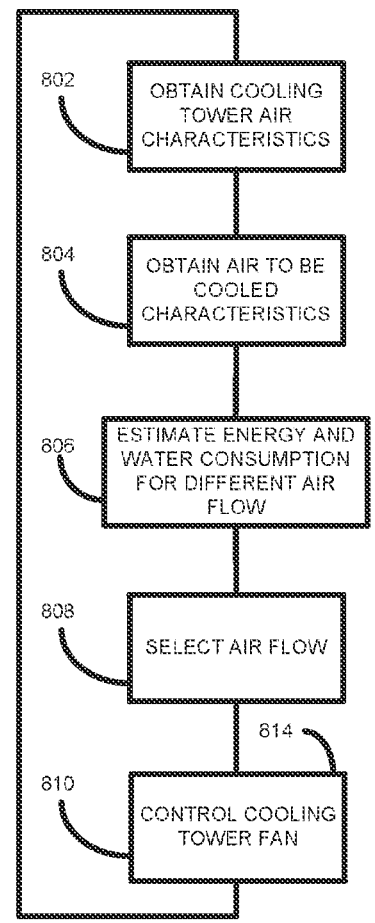

FIG. 6 a is a simplified section view of a cooling system according to an example of the present invention;

FIG. 7 is a simplified flow diagram outlining an example method of operating a cooling system according to an example of the present invention; and FIG. 8 is a simplified flow diagram outlining an example method of operating a cooling system according to a further example of the present invention.

DETAILED DESCRIPTION

Figure 1:
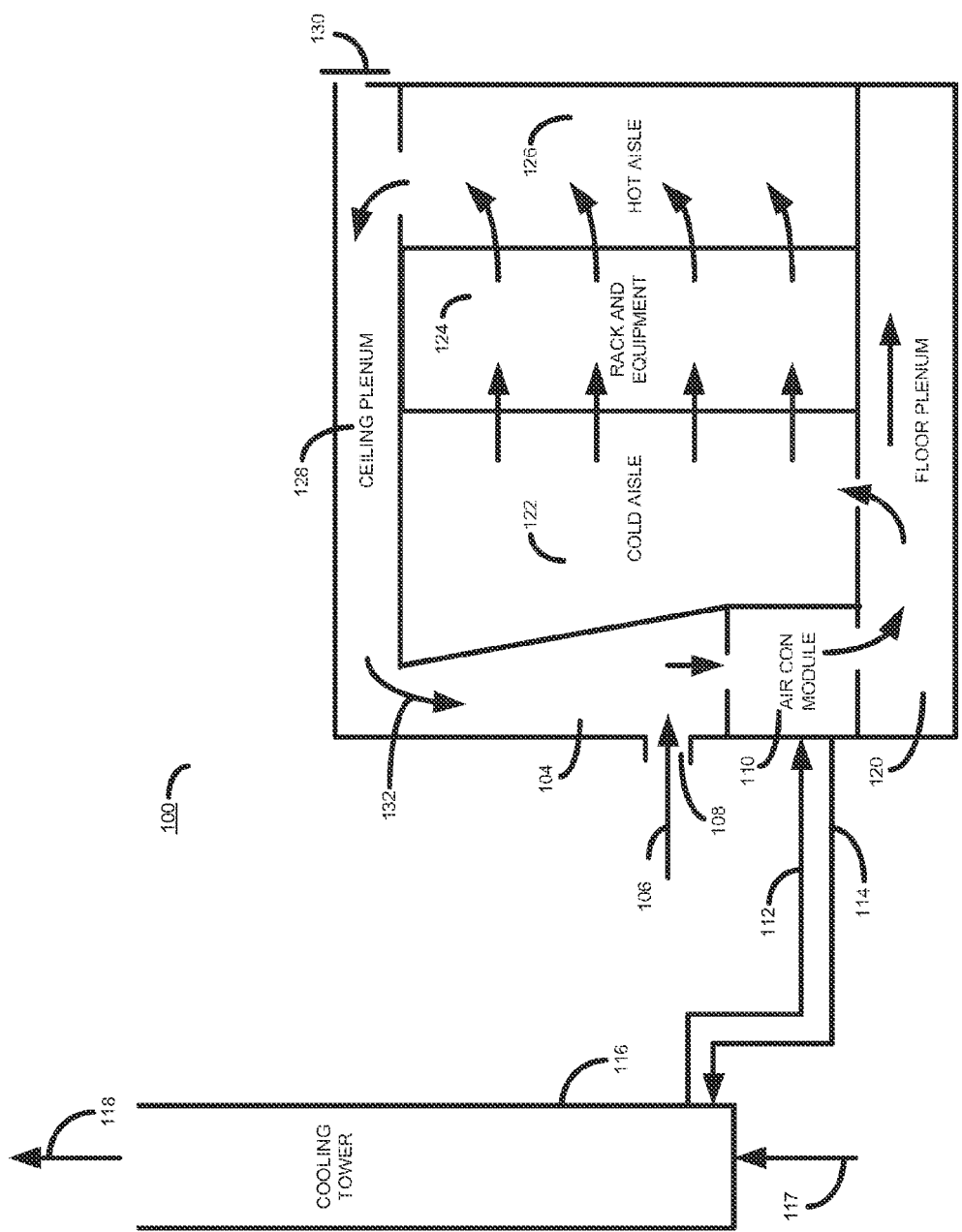
FIG. 1 is a simplified section view of a facility.

Referring now to FIG. 1, there shown a simplified section view of a portion of a traditional facility or structure 100, such as a data center.

An air conditioning module 110, draws in air from a duct or chamber 104. The term air conditioning module, unit, or system as used herein refers to apparatus that draws in air and expels air at a predetermined output temperature. In the context of the present description, the output temperature is generally lower than the temperature of the air drawn in, in which case the air conditioning module functions to remove heat from the air drawn in. The air conditioning system may also ensure that the output air is within a predetermined relative humidity range. Where the relative humidity of the air drawn in is outside the predetermined relative humidity range the air conditioning module dehumidifies or humidifies, as appropriate, the air to be within the predetermined range.

Outside air 106 is also drawn or forced into the duct or chamber 104. The outside air is used to maintain air quality in the data center at sufficient levels, primarily for the personnel who work within the facility 100. If outside climatic conditions permit, the outside air may also be used to provide cool air to the air conditioning module 110. The outside air may be introduced into the chamber 104 by mechanical ventilation means, such as by a fan or blower module (not shown).

The outside air 106 mixes with the return air 132 in the chamber 104 to form a substantially homogenous air mass that is then cooled by the air conditioning module 110 to a predetermined output temperature. If required, the air conditioning module 110 humidifies the air to ensure that the cooled air supplied to the data center is within predetermined relative humidity levels. The air conditioning module 110 may humidify the air using any suitable humidification techniques, including steam canisters, infrared and ultrasonic humidifiers, and the like.

The air conditioning module 110 cools the input air by blowing it across a network of cooling coils (not shown) in which circulate externally supplied chilled water 112. Warmed water 114 generated whilst cooling the air is fed through pipes to a cooling tower 116 where evaporative cooling techniques and heat exchangers (not shown) are used to cool the warmed water 114 and to return it as chilled water 112 back to the air conditioning module 110. Warmed air 118, generated during the evaporative cooling process is exhausted from the cooling tower 116 to the open air.

The cooled and humidified air is circulated by the air conditioning module 110 into a cold aisle 122 via a raised floor plenum 120. Cool air in the cold aisle 122 is drawn through computer and electronic equipment arranged in racks 124 where it is warmed as it cools the equipment. The warmed air is exhausted by the equipment into a hot aisle 126 where it vents or is ducted into a ceiling plenum 128. The ceiling plenum 128 has an outlet valve 130 for releasing excess air out of the facility 100, for example, to prevent air pressure build up. The warmed air in the ceiling plenum returns as return air 132 to the duct or chamber 104 where it is recycled into the air conditioning module 110.

The humidification of air by the air conditioning module 110 may consume large amounts of energy and water, especially where humidification is achieved by the transformation of water into steam.

Figure 2A:
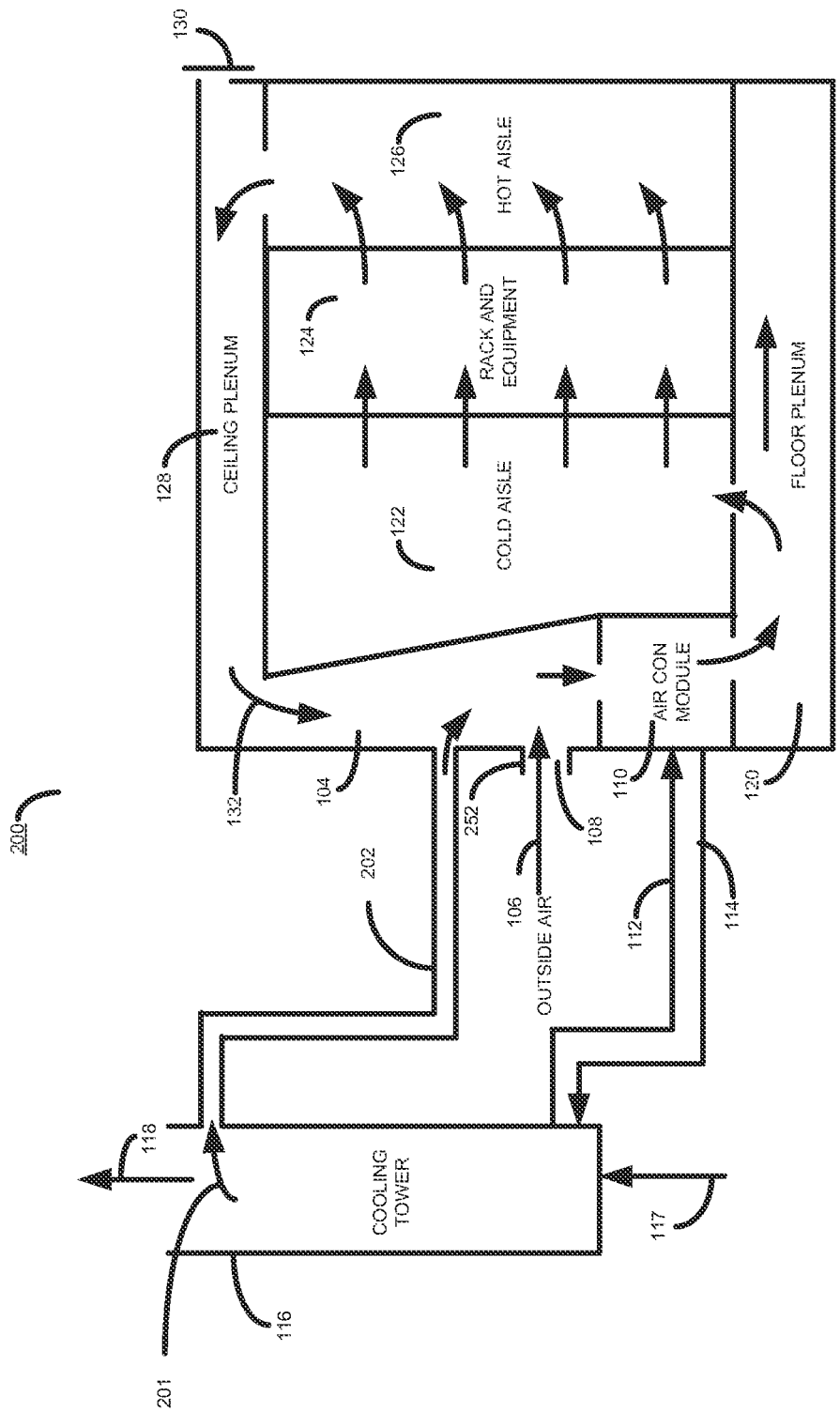
FIG. 2a is a simplified section view of a facility according to an example of the present invention.
Figure 2B:
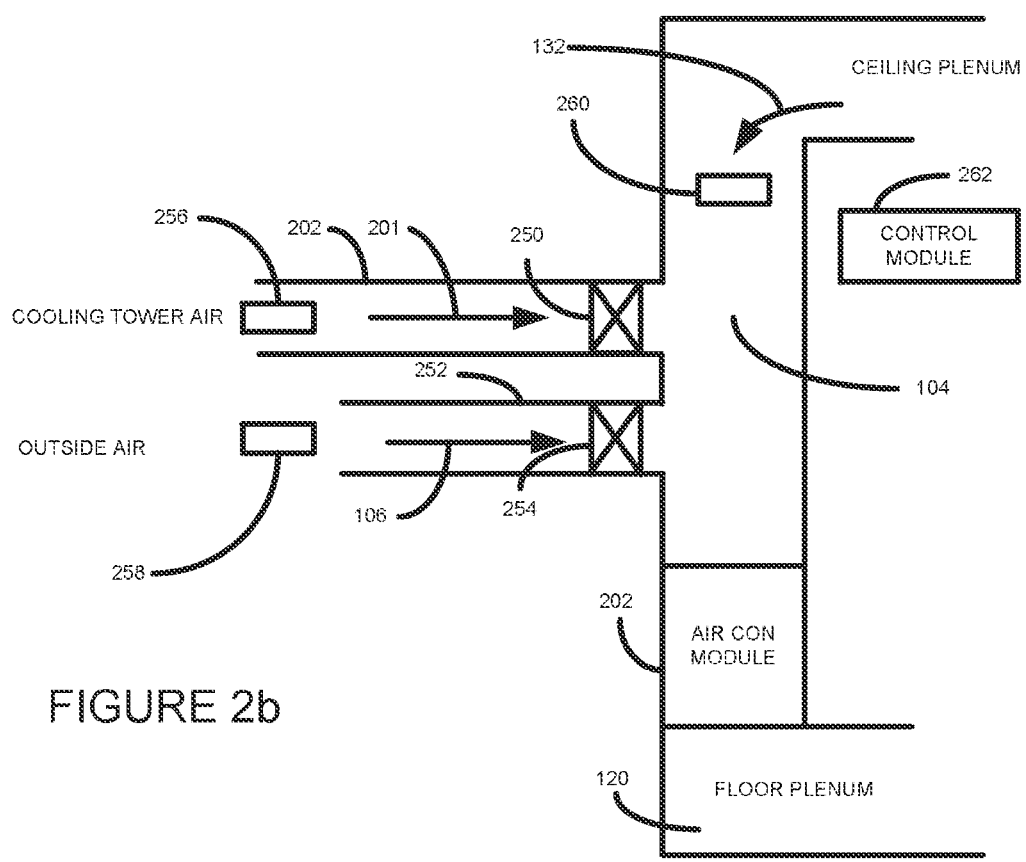
FIG. 2b is a simplified section view showing a portion of the facility of FIG. 2a in greater detail.

Referring now to FIG. 2a, there is shown a simplified section view of a facility 200, such as a data center, according to one example of the present invention. Reference numerals in common with those used in FIG. 1 indicate similar but not necessarily identical elements. FIG. 2b shows a portion of the facility of FIG. 2a in greater detail.

Examples and embodiments of the present invention, such as those described below, are based on the realization that the data centre air may be humidified within an acceptable relative humidity range through use of elements of a facility other than the air conditioning modules or additional humidifier modules. Accordingly, substantial energy savings and important reductions in the quantity of water used may be achievable. Furthermore, important cost savings may be obtainable.

As described above, the cooling tower 116 cools, using evaporative cooling techniques, warmed water 114 generated by the air conditioning module 110. The warmed water 114 may, for example, be circulated in the cooling tower in evaporator coils (not shown). The evaporative cooling process involves blowing outside air through water soaked evaporator pads which causes evaporation of some of the water. The phase change from liquid to gas requires the addition of heat which is supplied by the remaining water, which in turn becomes cooler. The cooled or chilled water 112 is returned to the air conditioning module 110 for use in cooling the data center air. A result of the evaporative cooling process is that hot air 118 having a high relative humidity is exhausted from the cooling tower into the open air. Depending on particular examples and specific operating conditions the air exhausted from the cooling tower 116 may be saturated or substantially saturated.

In one example a duct 202 is provided from the cooling tower 116 and is arranged in fluid communication with the chamber 104 of the facility 200. The duct 202 is used to supply hot exhaust air 201 from the cooling tower 116 for mixing, in the chamber or duct 104, with the outside air 106 supplied through a supply duct 252, and warm return air 132 from the ceiling plenum 128. Although FIG. 2a shows the duct 202 as being located in a top portion of the cooling tower 116, in other examples it may be arranged or positioned anywhere that permits the extraction of hot, highly humidified air, from the cooling tower. As will be appreciated by those skilled in the art, hotter air may contain a greater amount of water vapor than colder air.

The amount of hot air 201 supplied through the duct 202 may be varied by varying the speed of a variable speed fan 250 (shown in FIG. 2b) by a control module 262. The amount of outside air 106 supplied through the duct 252 may also be controlled by a variable speed fan 254.

As described below, the control module 262 determines the flow rate of air to be supplied through the duct 202 based on a number of environmental factors measured by a number of measurement devices or sensors 256, 258, and 260. Each of the measurement devices 256, 258, and 260 measures the dry-bulb temperature and relative humidity of air in contact therewith. In other examples the measurement devices may measure additional air characteristics including, but not limited to, flow rate, and wet-bulb temperature.

The control module 262 receives signals from the measurement devices 256, 258, and 260, and sends control signals to the variable speed fan 250. The signals may be suitably sent and received over a wired or wireless connection. The control module 262 may also send control signals to the fan 254.

Hot humid air is able to be taken from the cooling tower 116 and mixed with the air in the mixing chamber 104 since it has been realized that doing so does not lead to a significant increase in the temperature of the air entering the air conditioning module 110 where the flow rate of cooling tower air is small compared to the flow rate of the return air 132. However, it has been further realized that doing so does lead to a significant increase in the relative humidity of the air in the mixing chamber. In further examples the air from the cooling tower may be directly fed to an input manifold of the air conditioning module 110.

By way of example, it can be shown, using well known psychrometric principles, that where 20% cooling tower air at 40° C. and 100% RH is mixed with 80% outside air at 4° C. and 10% RH the resulting air will be at 9° C. and 94% RH. Similarly, if 92% of the same outside air is mixed with 8% of the same cooling tower air the resulting air will be at 7° C. and 53% RH.

By humidifying the air entering the air conditioning module 110 using the cooling tower air may enable all of the humidification requirements of the data center to be fulfilled, without requiring any additional humidification to be performed by the air conditioning module 110 or other humidifier modules. Accordingly, substantial energy and water savings may be achieved. Reductions in operating costs may also be obtained.

Figure 3:
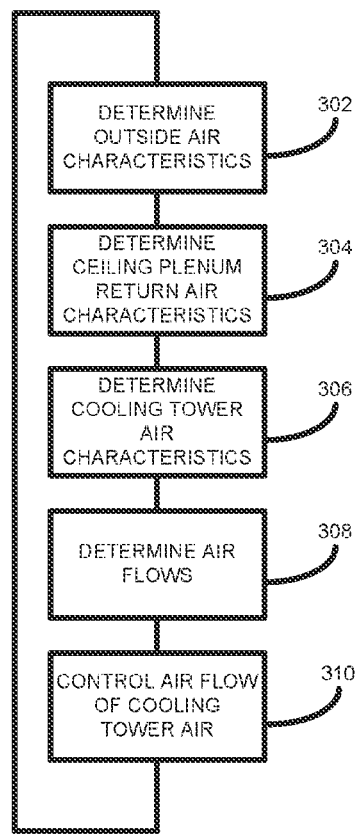
FIG. 3 is a simplified flow diagram outlining an example method of operating a control module of a facility according to an example of the present invention.

Referring now to FIG. 3 there is shown a flow diagram outlining a method of operating the control module 262 according one example.

At 302 the control module 262 receives signals from the measurement device 258 indicating the temperature and relative humidity of the outside air 202. At 304 the control module 262 receives signals from the measurement device 260 indicating the temperature and relative humidity of the ceiling plenum return air 132. At 306 the control module 262 receives signals from the measurement device 256 indicating the temperature and relative humidity of the cooling tower air 201.

At 308 the control module 262 determines, using well known psychrometric principles, the flow rate of cooling tower air 201 and the flow rate of outside air to introduce into the mixing chamber 104. The determined flow rates aim to ensure that the relative humidity of the cooled air input to the air conditioning module 202 is such that the air conditioning module 202 will not need to further humidify the air in order for the output air to be within the predetermined relative humidity range. In the present example, the flow rate (for example, volumetric or mass flow rate) of the return air 132 is taken as a the reference flow rate, and the flow rates of cooling tower air 201 and outside air 106 are determined relative to the flow rate of the return air 132.

At 310 the control module 262 sends control signals to the variable speed fans 250 and 254 to increase or decrease the fan speeds, as appropriate, to ensure that the determined flow rate of cooling tower air 201 and outside air 202 flows to the chamber 104.

By taking into account the temperature and humidity of the outside air 202, the ceiling plenum return air 132, and the cooling tower air 201 the control module is able to supply a flow rate of cooling tower air to ensure, where climatic conditions allow, that predetermined humidity levels within the facility 100 are met, without requiring use of air conditioning or other humidifier modules.

In this way, an amount of outside air 106 can be introduced to the mixing chamber 104 to cool the return air 132. At the same time, the humidity of the data center air may be maintained within acceptable levels by introducing an amount of cooling tower air 201 into the mixing chamber.

Such an approach may be particularly advantageous in systems where cold and dry outside air is used for cooling purposes. In cold and dry locations, the approaches described herein may extend the periods during which outside air may be used for cooling.

Figure 4:
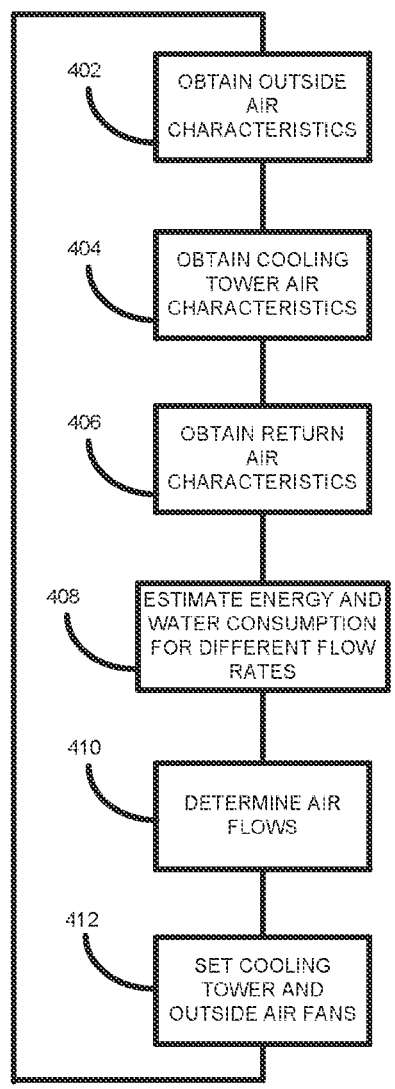
FIG. 4 is a simplified flow diagram outlining an example method of operating a control module according to a further example of the present invention.

Referring now to FIG. 4 there is shown a flow diagram outlining a further method of operating the control module 262 according to a further example. In this example the control module 262 determines an efficient manner of operating the cooling system of the facility 200, as will be described below in further detail.

At 402 the control module 262 obtains characteristics, such as temperature and relative humidity, of the outside air. At 404 the control module 262 obtains characteristics such as temperature and relative humidity of the cooling tower air 201. At 406 the control module 262 obtains characteristics such as a temperature, relative humidity, and flow rate of the ceiling plenum return air 132. At 408 the control module 262 estimates, for different flow rates of cooling tower air 201, outside air 202, and return air 132, the energy and water consumed by the cooling system.

The estimations of energy consumption may be based, for example, on known or measured energy characteristics of the air conditioning module 202, the fans 250 and 254, and other elements of the cooling system. The estimations of water consumption may be based, for example, on known or measured water consumption characteristics used by the air conditioning module 202 or other humidifier modules when humidifying air. The estimation of operating cost may be based, for example, on known electricity and water unit costs. The estimations may be calculated using known psychrometric principles.

The estimations may take into account, for example, the number of air conditioning modules in a cooling system. The estimations may also take into account whether a humidifier module of an air conditioning module is to be operated. This will depend on whether the relative humidity of the air entering the air conditioning module meets a predetermined minimum relative humidity level. For example, if the relative humidity of the air entering the air conditioning module is above a predetermined threshold, use of the humidifier module will not be required.

At 410 the control module 262 selects the flow rates depending on operational preferences. For example, if the operational preference is to operate the cooling system at lowest cost, the control module 262 selects the flow rates corresponding to the lowest estimated operating cost. If, for example, the operational preference is to operate the cooling system using the least amount of electricity, the control module 262 selects the corresponding flow rates. If, for example, the operation preference is to operate the cooling system at the lowest operating cost, the control module 262 selects the appropriate flow rates based on the estimations, and so on.

At 412 the control module 262 sends control signals to control the fans 250 and 254 to provide a flow rate of outside air 202 and cooling tower air 201 based on the selected flow rates.

After a predetermined time period the process at 402 is repeated to ensure that any changes in any of the cooling tower air, outside air, or ceiling plenum return air 132 characteristics are taken into account when calculating the mixing ratio. This helps ensure that the air output from the air conditioning module 202 is maintained within a predetermined humidity level range, whilst ensuring efficient operating of the cooling system.

Referring now to FIG. 6 there is shown a simplified block diagram of a cooling system 600 according to a further example. The cooling system 600 is suitable for, although is not limited to, use in air conditioning systems that do not require a flow of fresh outside air to be introduced.

The cooling system 600 comprises an air conditioning unit 602 for cooling air 604 using chilled water 608 to produce cooled air 606.

The cooling system 600 additionally comprises a cooling module or tower 614 that uses evaporative cooling apparatus (not shown) for cooling warmed water 610 generated by the air conditioning module 602. The evaporative cooling apparatus may include, for example, fans, evaporator pads, evaporator coils, heat exchangers, and the like. In operation the cooling tower cools the warmed water 610 to produce chilled water 608 that is in turn used by the air conditioning module 602, and exhausts hot air 618 that has a high relative humidity. Depending on particular examples and specific operating conditions the air exhausted from the cooling tower 614 may be saturated or substantially saturated.

A duct 622 is provided from the cooling tower 614 to a mixing chamber 634. A fan 626, controlled by a control module 630, allows a variable flow rate of air 616 from the cooling tower 614 to be input to the mixing chamber 634. A measurement device or sensor 620 enables characteristics such as the temperature and relative humidity of the cooling tower air 616 to be measured or determined.

The mixing chamber 634 enables cooling tower air 616 and air to be cooled 632 to mix together to form a substantially homogenous air mass. A measurement device or sensor 628 enables characteristics such as the temperature, relative humidity, and flow rate of the air to be cooled 632 to be measured or determined.

A method of operating the cooling system 600 according to one example will now be described, with further reference to the simplified flow diagram of FIG. 7.

The control module 630 determines (702) characteristics of the air to be cooled 632 and determines (704) characteristics of the cooling tower air 616 through use of the sensors 628 and 620 respectively. In the present example the characteristics may include dry bulb thermometer temperature, relative humidity levels, and air flow, although in other embodiments other characteristics may be determined or measured.

The control module 630 aims to create of mix of air to be cooled 632 and cooling tower air 616 in order to ensure that the relative humidity of the cooled air input to the air conditioning module 606 is such that the air conditioning module 606 will not need to further humidify the air in order for the output air to be within the predetermined relative humidity range.

Knowing the characteristics of the air to be cooled 632, the cooling tower air 616, and the target humidity limits for the air 604, the control module 630 determines (706) a flow rate of cooling tower air 616 to be input to the mixing chamber 634. The calculations may be based, for example, on well know psychrometric principles. Since in the current example the flow of air to be cooled 632 is substantially fixed, the control module 630 determines a flow rate of cooling tower air 616 to be added to the mixing chamber 634. Although not shown in FIG. 6, a one-way valve or other suitable mechanism may be used to prevent backflow of the cooling tower air into the air to be cooled conduit.

Once the control module 630 has determined the flow rate of cooling tower air 616 it controls (708) the fan 626 to provide the determined flow rate of cooling tower air 616 into the mixing chamber 634.

In this way, the relative humidity level of the air in the mixing chamber 634, and hence also the cooled air 606 output by the air conditioning module air conditioning module 602, can be maintained within predetermined limits without requiring the air conditioning module 602 to further humidify the cooled air. In one example, an acceptable relative humidity range may be around 45% to 55%. In other examples, other relative humidity ranges may be acceptable.

A further method of operating the cooling system 600 in an efficient manner according to a further example will now be described, with further reference to the simplified flow diagram of FIG. 8.

The control module 630 obtains (802 and 804) characteristics of cooling tower air 616 and air to be cooled 632 through the measurement devices or sensors 620 and 628 respectively. The characteristics may include, for example, dry bulb temperature, relative humidity, and flow rate. The control module 630 then estimates (806) for the cooling system 600 the consumption of one or more different resources based on different flow rates of cooling tower air 616 and air to be cooled 632. In one example, the consumption of energy is estimated. In another example, the consumption of water is estimated. In yet another example the operating cost of the cooling system 600 is estimated.

In the present example, the energy and water consumption and the operating cost of the cooling system 600 are estimated for different flow rates of cooling tower air 616 and air to be cooled 632. The estimations are based on producing output air 606 having a predetermined temperature and acceptable relative humidity range.

At 808 the control module 630 selects a flow rate depending on the operational preferences. For example, if the operational preference is to operate the cooling system at lowest cost, the control module 630 selects the flow rate of cooling tower air 616 corresponding to the lowest estimated operating cost. If, for example, the operational preference is to operate the cooling system using the least amount of electricity, the control module 630 selects the appropriate flow rate. It should be noted that under certain circumstances the selected flow rates may lead to the air conditioning module 602 humidifying air. However, depending on the operation preference, this may be acceptable.

At 810 the control module 630 sends signals to control the fans 626 to provide the selected flow rate of cooling tower air 616.

After a predetermined time period the process at 802 is repeated to ensure that any changes in any of the cooling tower air 616 or air to be cooled 632 characteristics are taken into account. This helps ensure that air output from the air conditioning module 602 is maintained within predetermined humidity levels, whilst ensuring that the cooling system is operating in an efficient manner in accordance with the operational preferences.

In some examples the control module 262 may be implemented by analogue control devices.

Figure 5:
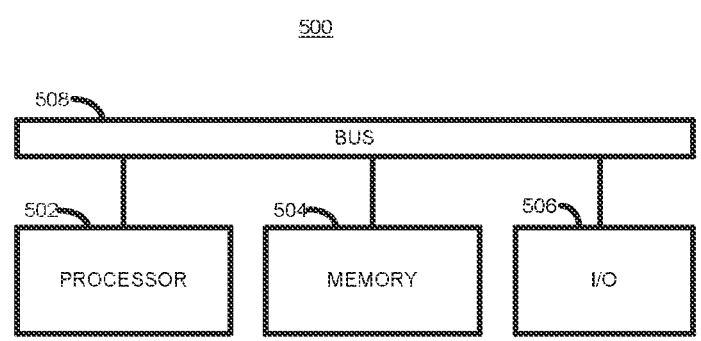
FIG. 5 is a simplified block diagram illustrating an example control module according to an example of the present invention.

In one example, such as that shown in FIG. 5, the control module 262 may be implemented using for example, a microprocessor, control logic, or micro controller 502 for executing machine readable instructions stored in a memory 504. The machine readable or computer executable instructions may, when executed by the processor 502, perform method steps as described above as a computer implemented method. Input and output operations may be handled by an I/O module 506. The processor 502, memory 504, and I/O interface 506 are coupled or are in communication via a bus 508.

In a further example a carrier carrying computer-implementable instructions is provided that, when interpreted by a computer, cause the computer to perform a method in accordance with any of the above-described embodiments.

Reference herein made to data centers is not intended to be limited thereto and is intended to encompass other kinds of facilities or structures housing equipment requiring cooling. Such other equipment may include, for example, power generation and electrical supply equipment, electricity transformation equipment, computing equipment, networking equipment, telecommunication equipment, data storage equipment, as well as other miscellaneous types of electronic and electrical equipment.

Reference herein made to air is not intended to be limited thereto and is intended to cover any other suitable gas or mix of gases.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention claimed is:

1. A cooling system, comprising:
   a water-cooled air conditioning module for cooling air from a chamber;
   a cooling module for cooling warm water generated by the air conditioning module;
   wherein the chamber is arranged for receiving air to be cooled, and air from the cooling module; and
   a control module configured to:
      determine characteristics of the air to be cooled and the air from the cooling module;
      determine, based on the determined characteristics, a flow rate of the air from the cooling module to be input to the chamber such that the air input to the air conditioning module has a relative humidity level within a predetermined range; and
      control the flow rate of the air from the cooling module to the chamber in accordance with the determined flow rate.

2. The cooling system of claim 1, wherein the control module is further configured to:
   determine characteristics of outside air; and
   determine, based on the determined characteristics of the outside air, the air to be cooled, and the air from the cooling module, the flow rate of the air from the cooling module and a flow rate of the outside air to be input to the chamber, such that the air output by the air conditioning module has a relative humidity level within the predetermined range; and
   control the flow rates of the air from the cooling module and the outside air input to the chamber in accordance with the determined flow rates.

3. The cooling system of claim 1, wherein the determined characteristics of the air from the cooling module include temperature and relative humidity, and wherein the determined characteristics of the air to be cooled include temperature, relative humidity, and flow rate.

4. The cooling system of claim 1 wherein the chamber is a mixing chamber in which at least the air from the cooling module and the air to be cooled mix to form a substantially homogeneous air mass.

5. The cooling system of claim 1, wherein the air conditioning module further comprises a humidifier for humidifying air in response to determining that the air input to the air conditioning module is below a predetermined relative humidity level.

6. The cooling system of claim 5 wherein the control module is further configured to determine the flow rate of the air from the cooling module to be input to the chamber such that the air input to the air conditioning module has a relative humidity level such that use of the humidifier is not required.

7. The cooling system of claim 1, wherein the control module is further configured to:
estimate, for different flow rates, an energy consumption of the cooling system, wherein the controlling of the flow rate includes selecting the flow rate based on the estimated energy consumption.

8. The cooling system of claim 1, wherein the control module is further configured to:
estimate, for different flow rates, a water consumption of the cooling system, wherein the controlling of the flow rate includes selecting the flow rate base on the estimated water consumption.

9. The cooling system of claim 1, wherein the control module is further configured to:
estimate, for different flow rates, an operating cost of the cooling system, wherein the controlling of the flow rate includes selecting the flow rate based on the estimated operating cost.

10. The cooling system of claim 1, wherein the cooling module is an evaporative cooling tower.

11. The cooling system of claim 10, wherein the air from the cooling tower is taken from a portion of the cooling tower.

12. The cooling system of claim 1, further comprising a mechanical ventilator for controlling the flow rate of the air from the cooling tower.

13. A method of operating a cooling system comprising a water-cooled air conditioning module for cooling warm air, an evaporative cooling tower for cooling warm water generated by the air conditioning module, a mixing chamber for receiving the warm air, outside air, and air from the cooling tower, the method comprising:
obtaining characteristics of the air from the cooling tower, the outside air, and the warm air;
determining, based on the obtained characteristics, a flow rate of the air from the cooling tower and a flow rate of the outside air to input to the mixing chamber, the flow rate determined such that the air in the mixing chamber has a relative humidity level within a predetermined range; and
controlling flow rates of the air from the cooling tower and the outside air input to the mixing chamber in accordance with the determined flow rates.

14. The method of claim 13, wherein obtaining the characteristics comprises obtaining temperature and relative humidity.

15. The method of claim 14, wherein obtaining the characteristics further comprises obtaining a flow rate.

16. The method of claim 13, further comprising determining the flow rates such that the air in the mixing chamber does not require further humidification.

17. The method of claim 13, further comprising:
estimating, for different flow rates, an energy consumption of the cooling system, wherein the controlling of the flow rates comprises selecting the flow rates of the air from the cooling tower and the outside air based on the estimated energy consumption.

18. The method of claim 13, further comprising:
estimating, for different flow rates, a water consumption of the cooling system, wherein the controlling of the flow rates comprises selecting the flow rates of the air from the cooling tower and the outside air based on the estimated water consumption.

19. The method of claim 13, further comprising:
estimating, for different flow rates, an operating cost of the cooling system, wherein the controlling of the flow rates comprises selecting the flow rates of the air from the cooling tower and the outside air based on the estimated operating cost.

20. The cooling system of claim 1, further comprising a sensor to measure at least one characteristic of the air from the cooling module provided from the cooling module through a duct to the chamber, and wherein the control module is configured to determine the at least one characteristic of the air from the cooling module based on receiving information from the sensor.

21. The cooling system of claim 1, further comprising an inlet to deliver outside air to the chamber for mixture with the air from the cooling module and the air to be cooled.

22. The method of claim 13, wherein obtaining the characteristics of the air from the cooling tower uses at least one sensor that measures the characteristics of the air from the cooling tower passed through a duct from the cooling tower to the mixing chamber.

23. A non-transitory machine-readable storage medium storing instructions that upon execution cause a computer to:
receive characteristics of air to be cooled and air from a cooling module that cools warmed liquid from an air conditioning module for cooling air from a chamber, the cooling module to provide cooled liquid to the air conditioning module, the chamber to receive a mixture of at least the air to be cooled and the air from the cooling module;
determine, based on the characteristics, a flow rate of the air from cooling module for input to the chamber, the determined flow rate to achieve a relative humidity of cooled air delivered by the air conditioning module to within a predefined humidity range;
control the flow rate of the air from the cooling module into the chamber according to the determined flow rate.

24. The non-transitory machine-readable storage medium of claim 23, wherein the instructions are executable to further:
receive characteristics of outside air;
determine, based on the characteristics of the outside air, the air to be cooled, and the air from the cooling module, the flow rate of the air from the cooling module and a flow rate of the outside air to be input to the chamber, the determined flow rates to achieve the relative humidity of the cooled air delivered by the air conditioning module to be within the predefined humidity range; and
control the flow rates of the air from the cooling module and the outside air input to the chamber in accordance with the determined flow rates.

* * * * *